US006259595B1

(12) United States Patent
Hebel et al.

(10) Patent No.: US 6,259,595 B1
(45) Date of Patent: Jul. 10, 2001

(54) ARRANGEMENT TO SECURE A METAL HOUSING OF AN ELECTRICAL COMPONENT ONTO A HEAT DISSIPATION PLATE

(75) Inventors: Rainer Hebel; Wilhelm Schweikert, both of Heidenheim (DE)

(73) Assignee: Siemens Matsushita Components GmbH & Co. KG, Munich (DE)

( * ) Notice: Subject to any disclaimer, the term of this patent is extended or adjusted under 35 U.S.C. 154(b) by 0 days.

(21) Appl. No.: 09/424,189

(22) PCT Filed: Mar. 27, 1998

(86) PCT No.: PCT/DE98/00894
§ 371 Date: Nov. 19, 1999
§ 102(e) Date: Nov. 19, 1999

(87) PCT Pub. No.: WO98/53468
PCT Pub. Date: Nov. 26, 1998

(30) Foreign Application Priority Data

May 21, 1997 (DE) .............................................. 197 21 287

(51) Int. Cl.[7] ........................................................ H01G 2/10
(52) U.S. Cl. ............................................. 361/517; 361/535
(58) Field of Search ............................ 361/509, 517–519, 361/529, 534–539

(56) References Cited

FOREIGN PATENT DOCUMENTS 43 31 377   3/1995   (DE) .

*Primary Examiner*—Anthony Dinkins
(74) *Attorney, Agent, or Firm*—Schiff Hardin & Waite

(57) ABSTRACT

An electrical component is installed in a metallic housing having a planar housing floor, in which the housing is pressed against a heat dissipation plate by means of screwable tension elements that are situated adjacent the housing wall. The tension elements have peaks at a portion that faces the housing wall. The housing has an indentation in the clamping region of the tension elements which serves as an aid to assembly, and the center line of the indentation is arranged higher prior to the fixing of the housing by means of the peak of the tension elements than subsequent thereto.

10 Claims, 2 Drawing Sheets

ARRANGEMENT TO SECURE A METAL HOUSING OF AN ELECTRICAL COMPONENT ONTO A HEAT DISSIPATION PLATE

The invention relates to an electrical component, particularly an aluminum electrolyte capacitor, which is installed in a metallic housing with a planar housing floor or base, in which the housing is pressed against a heat dissipation plate with the aid of screwable tension elements arranged adjacent the housing wall. The tension elements comprise a peak at a face that faces the housing wall, and in which the tension elements have a borehole that is arranged parallel to the faces, and the elements deform the housing in the fixing process.

A component of this type is taught in DE 43 31 377 A 1. Due to a particular construction of the borehole, the known tension element is initially situated at a slant and is then keyed to the housing by turning the screws. However, the slanted positioning complicates the insertion of the screws into the assembly holes, or respectively, into the threading in the assembly plate.

SUMMARY OF THE INVENTION

It is the object of the invention to propose an Electrical component of the above type in which the housing can be easily pressed on to the heat dissipation plate.

This object is inventively achieved in that the housing has an indentation in the clamping region of the tension elements which serves as an aid to assembly, and that subsequent to the fixing process the center line of the indentation is arranged higher than the peak of the tension elements.

The indentation may be a circumferential bead or a series of indentations which are only located in the region of the tension or fastening elements. The peak of the tension or fastening element is preferably formed by two surfaces which are inclined toward each other. The borehole of the element preferably has an expanded portion or counterbore.

The subject matter of the invention is detailed below with the aid of the exemplifying embodiments.

The following are shown in the drawings:

DESCRIPTION OF THE PREFERRED EMBODIMENT

Figure 1:
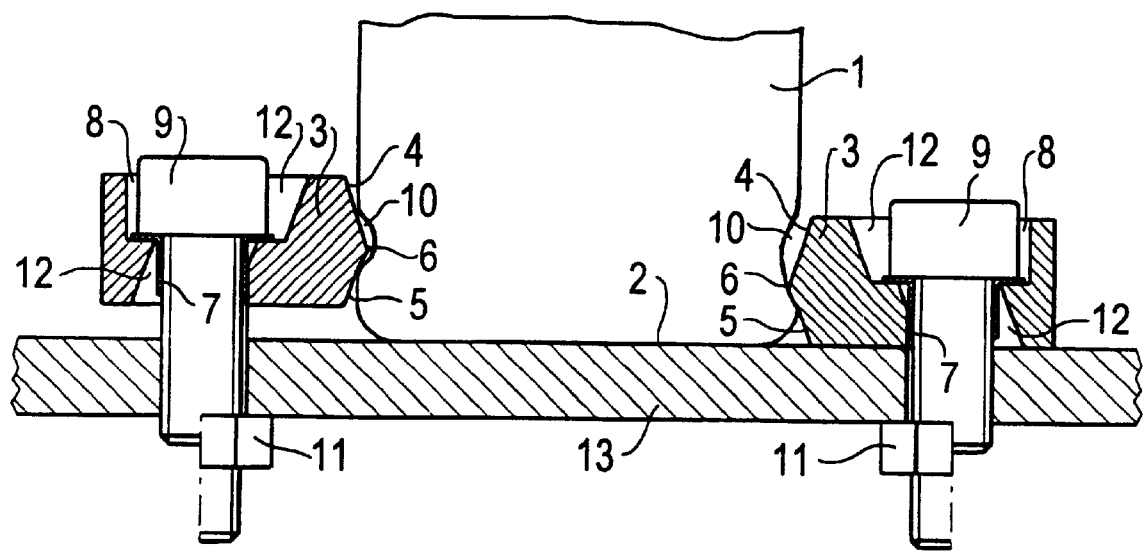
FIG. 1 is a sectional view of a housing which is arranged on a heat dissipation plate, in the untightened and tightened condition.

FIG. 1 depicts a metallic housing or ball 1, whose floor, base or bowl bottom 2 is pressed against a heat dissipation plate 13 with the aid of tension elements 3. At the face of the tension or fastening elements 3, which are situated adjacent the wall of the housing in the installed condition, two surfaces 4,5 are arranged, which are inclined toward each other, to form a peak 6. The size of the surfaces 4,5 is preferably dimensioned such that the peak 6 is centrally arranged.

In the tension elements 3, a borehole 7 with a broadened head part or counterbore 8 is arranged. The tension elements 3 are screwed down to the heat dissipation plate 13 with the aid of screws 9, which are led through the boreholes 7, so that the housing 1 enjoys good mechanical contact with the heat dissipation plate 13 via the housing floor or base 2. To facilitate assembly, the housing 1 has at least one indentation 10, the center line of said indentation 10 being arranged above the position of the tension elements 3 attained subsequent to the fixing process.

In the left half of FIG. 1, the loose condition at the beginning of assembly is illustrated, and in the right half of FIG. 1, the tightened condition subsequent to the tightening of the screws 9 is illustrated. The screws are tightened with the aid of nuts 11, though threaded boreholes may also be provided in the heat dissipation plate 13.

In the tightening of the screws 9, the tension element 3 is pressed down in the direction of the bowl bottom 2, whereby the deformation (tolerance balancing) of the housing that is required for optimal fixings is achieved. Here, the fixing of the housing 1 occurs via the stable bowl bottom 2 and not via the generally thin bowl wall.

It emerges from FIG. 1 that the tension elements 3 are arranged horizontally prior to assembly, so that the complicated insertion of the screws 9 by the slanting of tension elements as in the assembly taught in the above cited prior art is no longer necessary.

To facilitate the assembly, recesses 12 can be provided in the boreholes 7 in known fashion, enabling a simple slanting of the tension elements.

Figure 2:
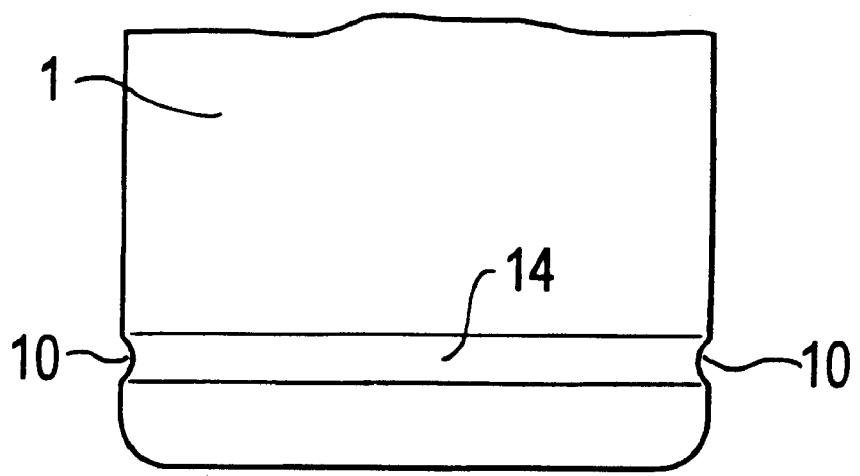
FIGS. 2 and 3 are side views of housings with different indentations.

FIG. 2 illustrates an embodiment of a housing bowl 1 in which the indentation 10 is constructed as a circumferential bead 14.

Figure 3:
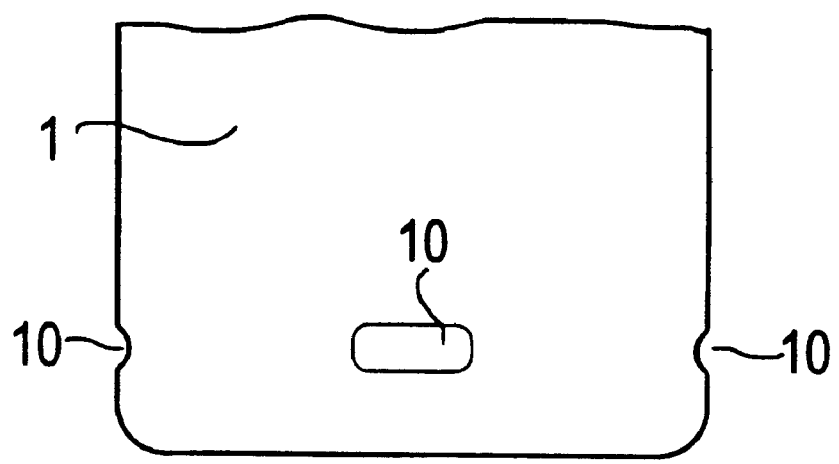

FIG. 3 illustrates an embodiment of a housing 1 in which the indentations 10 are arranged only in the region that is provided for the tension elements 3.

The indentations 10 need not necessarily be arranged in the capacitor housing 1 from the outset; they can also be attached to the finished capacitor subsequently with the aid of a suitable device, whereby it is of no consequence whether or not the capacitor housing 1 is constructed with insulation.

What is claimed is:

1. Electrical component being installed in a metallic housing having a housing wall and a planar housing floor, the housing being pressed against a heat dissipation plate by means of screwable tension elements that are situated adjacent the housing wall, each of the tension elements having a face with a peak that faces the housing wall, and each of the tension elements having a borehole that is arranged parallel to the housing wall, said elements deforming the housing in a fixing process, the improvement comprising the housing having an indentation in the clamping region of the tension elements, said indentation having a centerline and serving as an aid to assembly, and the centerline of the indentation being arranged higher than the peak of the tension elements.

2. Electrical component as claimed in claim 1,
  wherein the indentation is formed by a circumferential bead.

3. Electrical component as claimed in claim 1,
wherein the indentations is arranged only in the region of the tension elements.

4. Electrical component according to claim 3,
wherein the peak arranged at the face of the tension element that faces the housing wall is formed by two surfaces that are inclined against each other.

5. Electrical component according to claim 4,
wherein the borehole has an expanded head part.

6. An electrical component according to claim 2, wherein the peak arranged at the face of the tension element that faces the housing wall is formed by two surfaces that are inclined to each other.

7. An electrical component according to claim 6, wherein each borehole has a counterbore.

8. An electrical component according to claim 1, wherein the peak arranged at the face of the tension element that faces the housing wall is formed by two surfaces inclined to each other.

9. An electrical component according to claim 8, wherein each borehole has a counterbore.

10. An electrical component according to claim 1, wherein each borehole has a counterbore.

* * * * *